(12) United States Patent
Moyama et al.

(10) Patent No.: US 11,699,573 B2
(45) Date of Patent: Jul. 11, 2023

(54) PLASMA PROCESSING METHOD

(71) Applicant: TOKYO ELECTRON LIMITED, Tokyo (JP)

(72) Inventors: Kazuki Moyama, Miyagi (JP); Kazuya Nagaseki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 28 days.

(21) Appl. No.: 17/394,783

(22) Filed: Aug. 5, 2021

(65) Prior Publication Data
US 2021/0375592 A1 Dec. 2, 2021

Related U.S. Application Data

(62) Division of application No. 16/270,811, filed on Feb. 8, 2019, now Pat. No. 11,107,663.

(30) Foreign Application Priority Data

Feb. 9, 2018 (JP) .................................. 2018-022037

(51) Int. Cl.
*H01J 37/32* (2006.01)
*H01L 21/67* (2006.01)
*H01L 21/3065* (2006.01)

(52) U.S. Cl.
CPC .. *H01J 37/32449* (2013.01); *H01J 37/32834* (2013.01); *H01L 21/3065* (2013.01); *H01L 21/67069* (2013.01); *H01J 2237/334* (2013.01)

(58) Field of Classification Search
CPC ........... H01J 37/32449; H01J 37/32834; H01J 2237/334; H01J 37/32844; H01J 37/32431; H01J 37/3244; H01L 21/67069; H01L 21/3065; H01L 45/1616; Y02C 20/30; Y02P 70/50; B01D 53/04; C23C 16/455;
(Continued)

(56) References Cited

U.S. PATENT DOCUMENTS 5,084,247 A 1/1992 Heisel et al.
6,328,801 B1 * 12/2001 Gary ...................... B01D 53/04
261/DIG. 27
(Continued)

FOREIGN PATENT DOCUMENTS

JP 2003-017416 A 1/2003
JP 2004-536447 A 12/2004
(Continued)

*Primary Examiner* — Rudy Zervigon
(74) *Attorney, Agent, or Firm* — Weihrouch IP

(57) ABSTRACT

A plasma processing system includes a chamber, a gas supply unit, a gas exhaust unit, a separating unit, a boost unit and an accumulation unit. The chamber is configured to process a target substrate by plasma of a gaseous mixture of a rare gas and a processing gas. The gas supply unit is configured to supply the rare gas and the processing gas into the chamber. The gas exhaust unit is configured to exhaust a gas containing the rare gas from the chamber. The separating unit is configured to separate the rare gas from the gas exhausted by the gas exhaust unit. The boost unit is configured to boost the rare gas separated by the separating unit. The accumulation unit is configured to accumulate the rare gas boosted by the boost unit and supply the accumulated first rare gas to the gas supply unit.

19 Claims, 14 Drawing Sheets

(58) Field of Classification Search
CPC . C23C 16/4412; C23C 16/18; C23C 16/4481;
B05D 1/60
USPC ...................................... 427/248.1
See application file for complete search history.

(56) References Cited

U.S. PATENT DOCUMENTS

| | | | |
|---|---|---|---|
| 2004/0255854 A1 | 12/2004 | Sakai et al. | |
| 2009/0238972 A1* | 9/2009 | Clark | C23C 16/24 118/712 |
| 2013/0139690 A1* | 6/2013 | Ohuchi | B01D 53/75 96/108 |

FOREIGN PATENT DOCUMENTS

| | | |
|---|---|---|
| JP | 2005-103400 A | 4/2005 |
| JP | 2005-336046 A | 12/2005 |
| JP | 2008-066339 A | 3/2008 |
| JP | 2012-124447 A | 6/2012 |
| JP | 2014-227968 A | 12/2014 |
| TW | I399236 B | 6/2013 |
| WO | 02-075790 A2 | 9/2002 |
| WO | 2006/067384 A1 | 6/2006 |
| WO | 2006/100428 A1 | 9/2006 |

* cited by examiner

FIG.10

PLASMA PROCESSING METHOD

CROSS-REFERENCE TO RELATED APPLICATIONS

This application is a divisional of U.S. patent application Ser. No. 16/270,811, filed Feb. 8, 2019, which claims priority to Japanese Patent Application No. 2018-022037 filed on Feb. 9, 2018, the entire contents of which are incorporated herein by reference.

TECHNICAL FIELD

The present disclosure relates to a plasma processing method.

BACKGROUND

For example, in a semiconductor manufacturing process, a processing gas is used in processing such as etching or the like for a semiconductor wafer as a target substrate. The semiconductor wafer is loaded into a chamber, and a processing gas is supplied into the chamber to perform predetermined processing on the semiconductor wafer. The processing gas used for processing the semiconductor wafer is exhausted after $CO_2$ gas, $NO_x$ gas, fine particles and the like are removed.

Recently, it has been studied to use a rare gas such as krypton gas or xenon gas as a rare gas to be added to a processing gas. The rare gas is expensive because it has a low abundance ratio and it is difficult to purify the rare gas. Therefore, it is considered to recover the rare gas from the exhaust gas discharged from a processing chamber and reuse it. A pressure swing adsorption (PSA) method is known as a method for separating and recovering a rare gas such as krypton gas or xenon gas from the exhaust gas (see, e.g., Japanese Patent Application Publication No. 2005-103400).

However, the PSA method is disadvantageous in that processing is complicated and an apparatus is scaled-up. Accordingly, there is a demand for a technique for simply and easily separating and recovering a rare gas from an exhaust gas.

SUMMARY

In accordance with an aspect, there is provided a plasma processing system including a chamber, a gas supply unit, a gas exhaust unit, a separating unit, a boost unit and an accumulation unit. The chamber is configured to process a target substrate by plasma of a gaseous mixture of a rare gas and a processing gas. The gas supply unit is configured to supply the rare gas and the processing gas into the chamber. The gas exhaust unit is configured to exhaust a gas containing the rare gas from the chamber. The separating unit is configured to separate the rare gas from the gas exhausted by the gas exhaust unit. The boost unit is configured to boost the rare gas separated by the separating unit. The accumulation unit is configured to accumulate the rare gas boosted by the boost unit and supply the accumulated first rare gas to the gas supply unit.

In accordance with another aspect, there is provided a plasma processing method comprising: supplying a rare gas and a processing gas into a chamber; processing a target substrate by plasma of a gaseous mixture obtained by mixing the rare gas and the processing gas; exhausting a gas containing the rare gas from the chamber; separating the rare gas from the gas exhausted from the chamber; boosting the separated rare gas; and accumulating the boosted rare gas in an accumulation unit, wherein in the supply of the rare gas and the processing gas into the chamber, the processing gas and the rare gas supplied from the accumulation unit are supplied into the chamber.

BRIEF DESCRIPTION OF THE DRAWINGS

The objects and features of the present disclosure will become apparent from the following description of embodiments, given in conjunction with the accompanying drawings, in which:

FIG. 10 is a system configuration diagram showing an example of a plasma processing system according to a second embodiment;

DETAILED DESCRIPTION

Hereinafter, embodiments of the plasma processing system and the plasma processing method of the present disclosure will be described in detail with reference to the accompanying drawings. The following embodiments are not intended to limit the plasma processing system and the plasma processing method of the present disclosure.

First Embodiment

<Configuration of Plasma Processing System 10>

Figure 1:
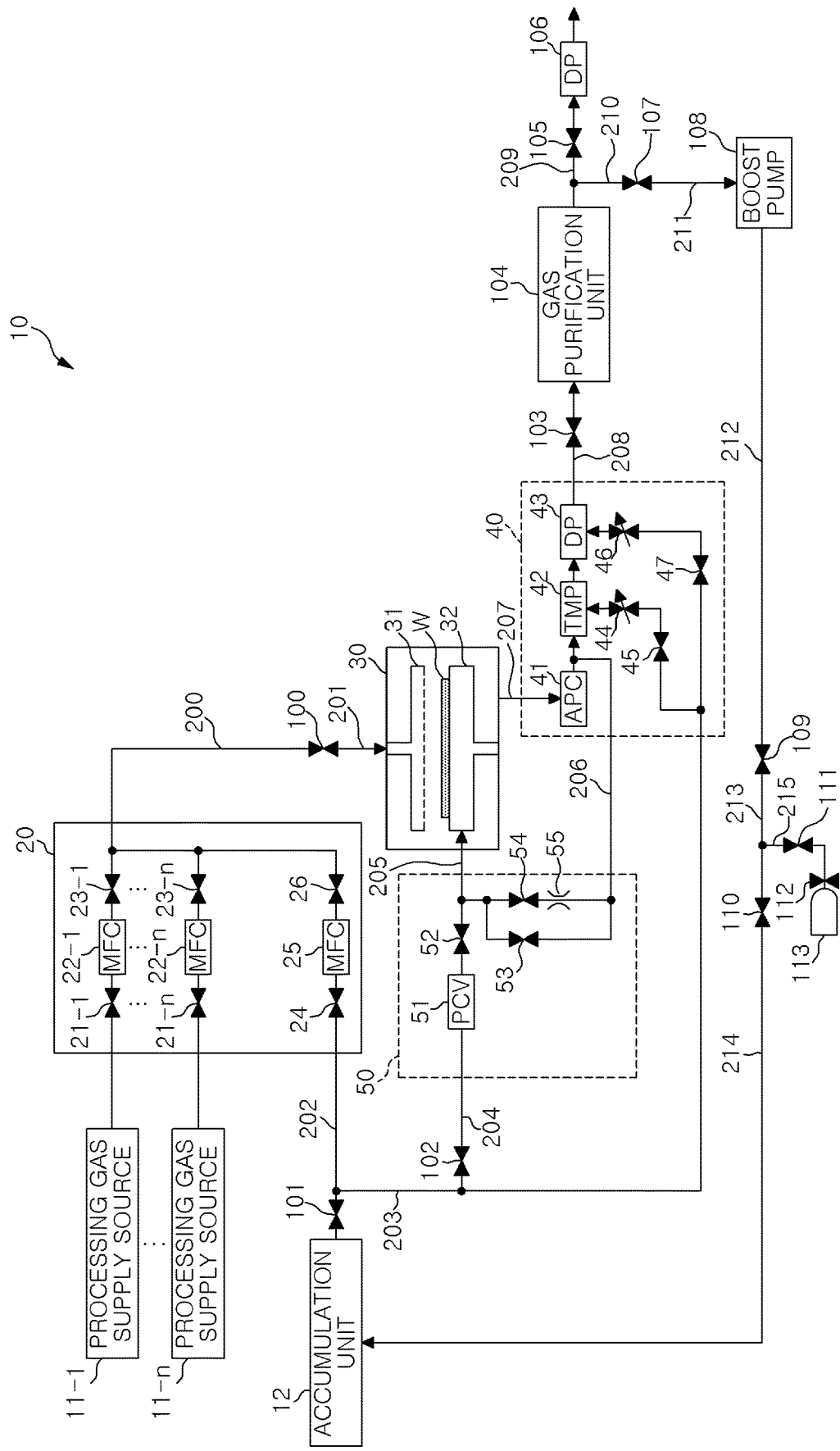
FIG. 1 is a system configuration diagram showing an example of a plasma processing system according to a first embodiment.

FIG. 1 is a system configuration diagram showing an example of the plasma processing system 10 according to a first embodiment. As shown in FIG. 1, for example, the plasma processing system 10 of the present embodiment includes a plurality of processing gas supply sources 11-1 to 11-n (n being an integer greater than or equal to 1), an accumulation unit 12, a first gas supply unit 20, a chamber 30, a gas exhaust unit 40, a second gas supply unit 50, a gas purification unit 104, and a boost pump 108. In the following description, when it is not necessary to distinguish the processing gas supply sources 11-1 to 11-*n*, they are collectively referred to as "processing gas supply source 11."

Each processing gas supply source 11 supplies a processing gas such as a fluorocarbon gas, a chlorine gas or the like into the chamber 30 through the first gas supply unit 20. The accumulation unit 12 accumulates the rare gas and supplies the accumulated rare gas to the first gas supply unit 20 and the gas exhaust unit 40 via a valve 101. Further, the accumulation unit 12 supplies the accumulated rare gas to the second gas supply unit 50 via the valve 101 and a valve 102. In the present embodiment, the rare gas accumulated in the accumulation unit 12 is, e.g., xenon (Xe) gas. The rare gas accumulated in the accumulation unit 12 is an example of a first rare gas.

The first gas supply unit 20 controls supply of the processing gases from the processing gas supply sources 11 and the rare gas from the accumulation unit 12 into the chamber 30 and stop of the supply. Further, the first gas supply unit 20 controls flow rates of the processing gases supplied from the processing gas supply sources 11 and the flow rate of the rare gas supplied from the accumulation unit 12. The first gas supply unit 20 generates a gaseous mixture by mixing the rare gas and the processing gas whose flow rates are controlled, and supplies the generated gaseous mixture into the chamber 30 via the valve 100.

Specifically, the first gas supply unit 20 includes a plurality of valves 21-1 to 21-*n*, a plurality of flow rate controllers, a plurality of valves 23-1 to 23-*n*, a valve 24, and a valve 26. The MFCs (Mass Flow Controllers) 22-1 to 22-*n* and the MFC 25 shown in FIG. 1 are examples of the flow rate controller. In the following description, the valves 21-1 to 21-*n* are collectively referred to as "valve 21"; the MFCs 22-1 to 22-*n* are collectively referred to as "MFC 22"; and the valves 23-1 to 23-*n* are collectively referred to as "valve 23" when it is not necessary to distinguish them.

A first end of the valve 21-1 is connected to the processing gas supply source 11-1 through a pipe. A second end of the valve 21-1 is connected to a first end of the MFC 22-1 through a pipe in the first gas supply unit 20. A second end of the MFC 22-1 is connected to a first end of the valve 23-1 through a pipe in the first gas supply unit 20. A second end of the valve 23-1 is connected to the valve 100 through a pipe 200. In the same manner, a first end of the valve 21-*n* is connected to the processing gas supply source 11-*n* through a pipe. A second end of the valve 21-*n* is connected to a first end of the MFC 22-*n* through a pipe in the first gas supply unit 20. A second end of the MFC 22-*n* is connected to a first end of the valve 23-*n* through a pipe in the first gas supply unit 20. A second end of the valve 23-*n* is connected to a first end of the valve 100 through the pipe 200. A second end of the valve 100 is connected to a gas inlet port of the chamber 30 through a pipe 201. Each MFC 22 controls the flow rate of the processing gas supplied from the corresponding processing gas supply source 11 to the chamber 30 via the valve 100 in response to an instruction from a control unit (not shown).

A first end of the valve 24 is connected to the accumulation unit 12 through a pipe 202 and the valve 101. A second end of the valve 24 is connected to a first end of the MFC 25 through a pipe in the first gas supply unit 20. A second end of the MFC 25 is connected to a first end of the valve 26 through a pipe in the first gas supply unit 20. A second end of the valve 26 is connected to a first end of the valve 100 through a pipe 200. The MFC 25 controls the flow rate of the rare gas to be added to the processing gas in response to an instruction from the control unit (not shown). In another embodiment, the first gas supply unit 20 may supply the rare gas and the processing gas into the chamber 30 without mixing them. The rare gas and the processing gas separately supplied into the chamber 30 are mixed in the chamber 30.

The chamber 30 is a vacuum processing chamber. Specifically, the chamber 30 includes a shower head 31 and a mounting table 32 therein. In the chamber 30, plasma of the gaseous mixture supplied from the first gas supply unit 20 through the pipe 201 is generated. In the chamber 30, predetermined processing such as etching or the like is performed on the target substrate (e.g., the semiconductor wafer W) by the generated plasma. In the present embodiment, the chamber 30 is a parallel plate type plasma processing chamber.

The shower head 31 supplies the gaseous mixture from the first gas supply unit 20 to the space in the chamber 30 through the pipe 201. The mounting table 32 has an electrostatic chuck on the top thereof. The semiconductor wafer W mounted on the electrostatic chuck is attracted and held by electrostatic force. Further, the mounting table 32 has therein a temperature control mechanism. The mounting table 32 controls a temperature of the semiconductor wafer W mounted on the electrostatic chuck by the temperature control mechanism. A rare gas is supplied from the second gas supply unit 50 to a gap between the upper surface of the electrostatic chuck and the backside of the semiconductor wafer W through a pipe 205. The temperature of the semiconductor wafer W is controlled by the rare gas supplied to the gap between the upper surface of the electrostatic chuck and the backside of the semiconductor wafer W.

In the present embodiment, a high frequency power from a high frequency generator (not shown) is applied to the shower head 31 and the mounting table 32. Plasma of the gaseous mixture supplied through the shower head 31 is generated in the chamber 30. Accordingly, predetermined processing such as etching or the like is performed on the semiconductor wafer W mounted on the mounting table 32.

The second gas supply unit 50 includes a pressure controller, valves 52 to 54, and an orifice 55. A pPressure control valve (PCV) 51 shown in FIG. 1 is an example of a pressure controller. The second gas supply unit 50 is connected to the accumulation unit 12 through a pipe 204, the valve 102, a pipe 203, a pipe 202 and the valve 101.

The second gas supply unit 50 supplies the rare gas accumulated in the accumulation unit 12 at a predetermined pressure to the gap between the upper surface of the electrostatic chuck and the backside of the semiconductor wafer W in the chamber 30. Specifically, after the semiconductor wafer W is attracted and held on the electrostatic chuck of the mounting table 32, the valves 101 and 102 are controlled to be opened. The PCV 51 controls the pressure of the rare gas supplied from the accumulation unit 12 to the gap between the upper surface of the electrostatic chuck and the backside of the semiconductor wafer W to a predetermined pressure via the valve 52 and the pipe 205. A part of the rare gas outputted from the valve 52 flows to a pipe 206 connected to the gas exhaust unit 40 via the valve 54 and the orifice 55. The rare gas flowing to the pipe 206 is exhausted by the gas exhaust unit 40. The valve 53 is provided in parallel to the valve 54 and the orifice 55. When the processed semiconductor wafer W is unloaded from the chamber 30, the rare gas supplied to the gap between the electrostatic chuck and the semiconductor wafer W is exhausted by the gas exhaust unit 40 via the valve 53 and the pipe 206.

The gas exhaust unit 40 includes an automatic pressure controller (APC) 41, a turbo molecular pump (TMP) 42, a dry pump (DP) 43, a pressure control valve 44, a valve 45, a pressure control valve 46 and a valve 47. The gas exhaust unit 40 exhausts a gas containing a rare gas from the chamber 30. The APC 41 is connected to a gas exhaust port of the chamber 30 through a pipe 207. The APC 41 controls the pressure in the chamber 30 by controlling the opening degree of the valve. The pressure control valve 44, the valve 45, the pressure control valve 46 and the valve 47 are examples of a third gas supply unit.

The TMP 42 and the DP 43 suck the gas in the chamber 30 through the pipe 207 and the APC 41 by rotation of an impeller supported in a non-contact manner through a magnetic bearing. The sucked gas flows to the gas purification unit 104 through a pipe 208 and the valve 103. The valves 45 and 47 are connected to the accumulation unit 12 through the pipe 203 and the valve 101. The rare gas from the accumulation unit 12 is supplied to the impeller in the TMP 42 via the pressure control valve 44 and the valve 45. The rare gas from the accumulation unit 12 is supplied to the gap formed between the magnetic bearing and the impeller in the TMP 42 via the pressure control valve 44 and the valve 45. The rare gas from the accumulation unit 12 is supplied to the impeller in the DP 43 via the pressure control valve 46 and the valve 47. The rare gas from the accumulation unit 12 is supplied to the gap between the magnetic bearing and the impeller in the DP 43 via the pressure control valve 46 and the valve 47. Accordingly, particles adhered to the impeller are purged, and the heat accumulated in the impeller is dissipated to the magnetic bearing or the like by the rare gas supplied to the gap between the magnetic bearing and the impeller. The rare gas supplied to the impeller and to the gap between the magnetic bearing and the impeller flows to the gas purification unit 104 through the pipe 208 and the valve 103.

The gas purification unit 104 separates the rare gas from the gas exhausted by the gas exhaust unit 40. For example, the gas purification unit 104 removes fluorine compounds in the exhaust gas by calcium hydroxide or the like, removes $H_2O$ in the exhaust gas by zeolite or the like, removes oxygen in the exhaust gas by a Cu catalyst or the like, removes $NO_x$, $CO_2$, fine particles and the like in the exhaust gas. The rare gas separated from the exhaust gas by the gas purification unit 104 flows to the boost pump 108 through the pipe 210, the valve 107 and a pipe 211. In the present embodiment, one rare gas such as Xe gas or the like is used and, thus, the rare gas can be easily separated from the other gases. The gas purification unit 104 is an example of a separating unit. The removal herein may include removal using adsorption.

The boost pump 108 boosts the rare gas separated from the gaseous mixture by the gas purification unit 104 to a predetermined pressure. The boosted rare gas is accumulated in the accumulation unit 12 through a pipe 212, a valve 109, a pipe 213, a valve 110 and a pipe 214. The DP 106 is connected to the gas purification unit 104 through a pipe 209 and a valve 105. A cylinder 113 in which a rare gas is accumulated is connected to a pipe 213 between the valve 109 and the valve 110 through a pipe 215, a valve 111 and a valve 112. The boost pump 108 is an example of a boost unit. The valve 112 may be a regulator for controlling a pressure. Accordingly, the rare gas supplied from the cylinder 113 can be sent at a constant pressure to the accumulation unit 12.

<Plasma Treatment>

Figure 2:
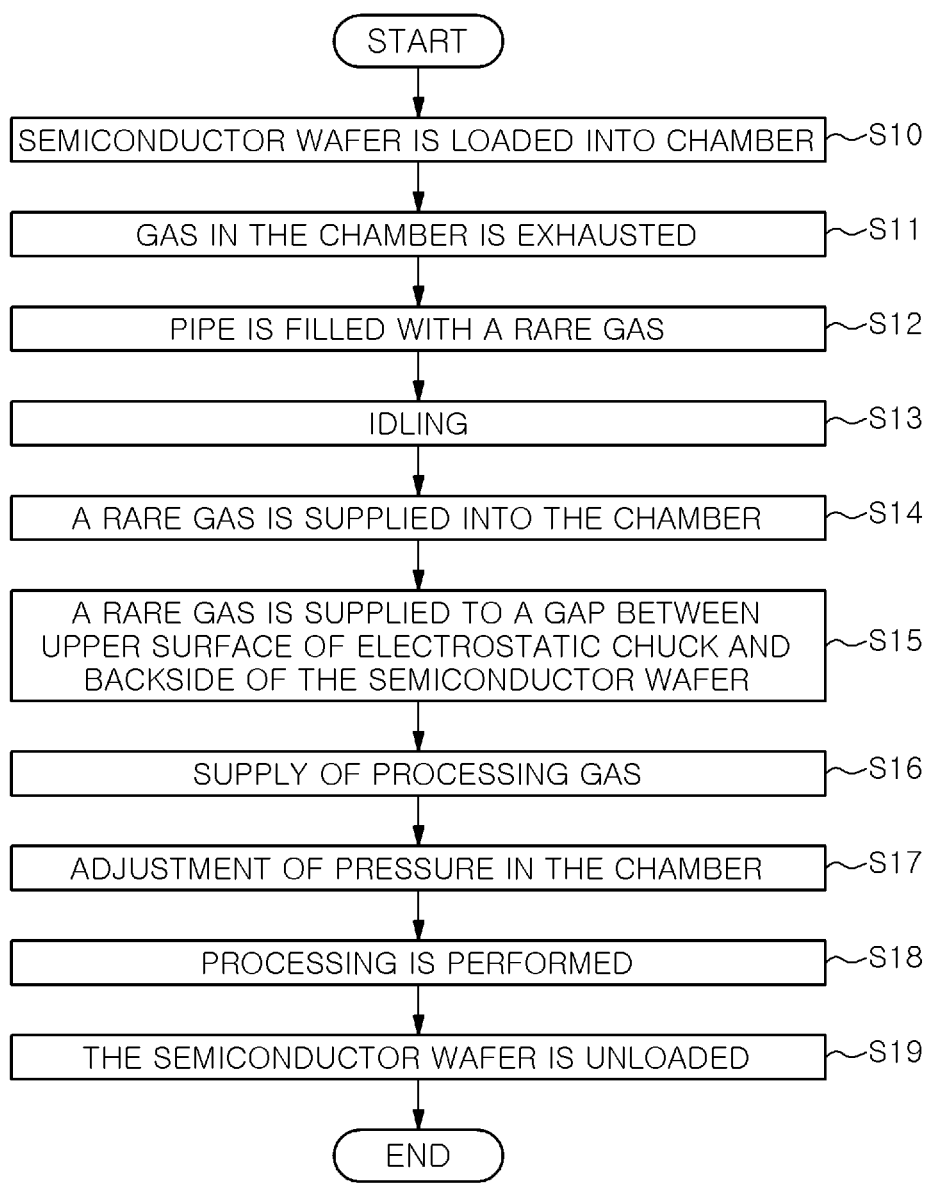
FIG. 2 is a flowchart showing an example of plasma processing.

FIG. 2 is a flowchart showing an example of plasma processing. Hereinafter, the operation of the plasma processing system 10 will be described with reference to FIGS. 1 and 3 to 9. In FIGS. 1 and 3 to 9, white valves indicate valves controlled to be opened, and black valves indicate valves controlled to be closed. In an initial state, in the plasma processing system 10, all the valves are controlled to be closed as shown in FIG. 1, for example.

Figure 3:
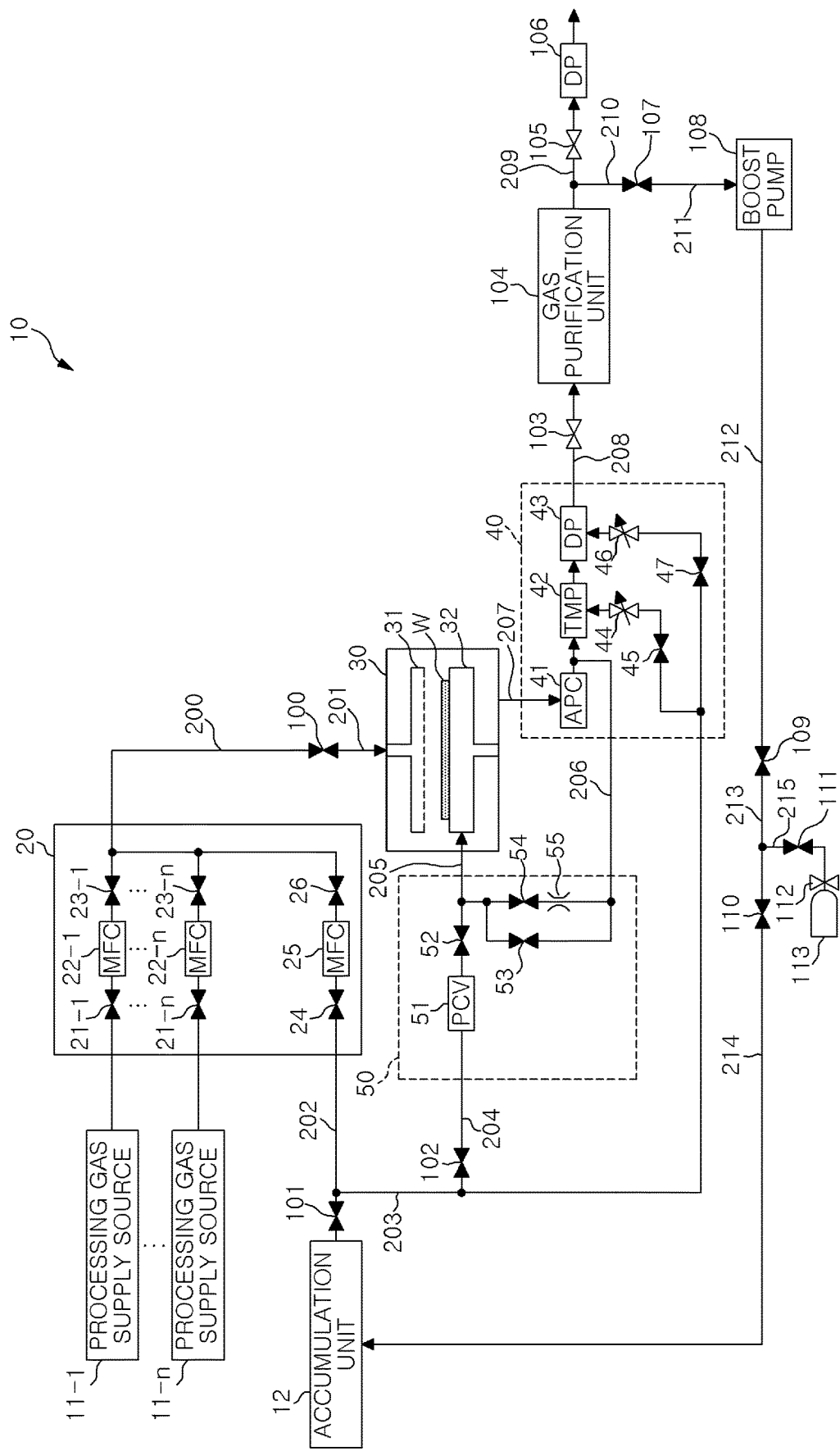
FIG. 3 shows a state of each valve at the time of performing vacuum evacuation in a chamber.

First, the semiconductor wafer W is loaded into the chamber 30 (S10). The semiconductor wafer W is mounted on the electrostatic chuck of the mounting table 32. Then, the gas in the chamber 30 is exhausted (S11). FIG. 3 shows a state of each valve at the time of vacuum-evacuating the chamber 30. In step S11, the valve 112 connected to the cylinder 113 is controlled to be opened, and the pressure control valves 44 and 46 and the valves 103 and 105 are controlled to be opened. Then, the APC 41 is controlled to maximize the opening degree of the valve, and the DP 106 operates. Accordingly, the gas in the chamber 30 is exhausted by the DP 106 through the pipe 207, the gas exhaust unit 40, the pipe 208, the valve 103, the gas purification unit 104, the pipe 209 and the valve 105.

Figure 4:
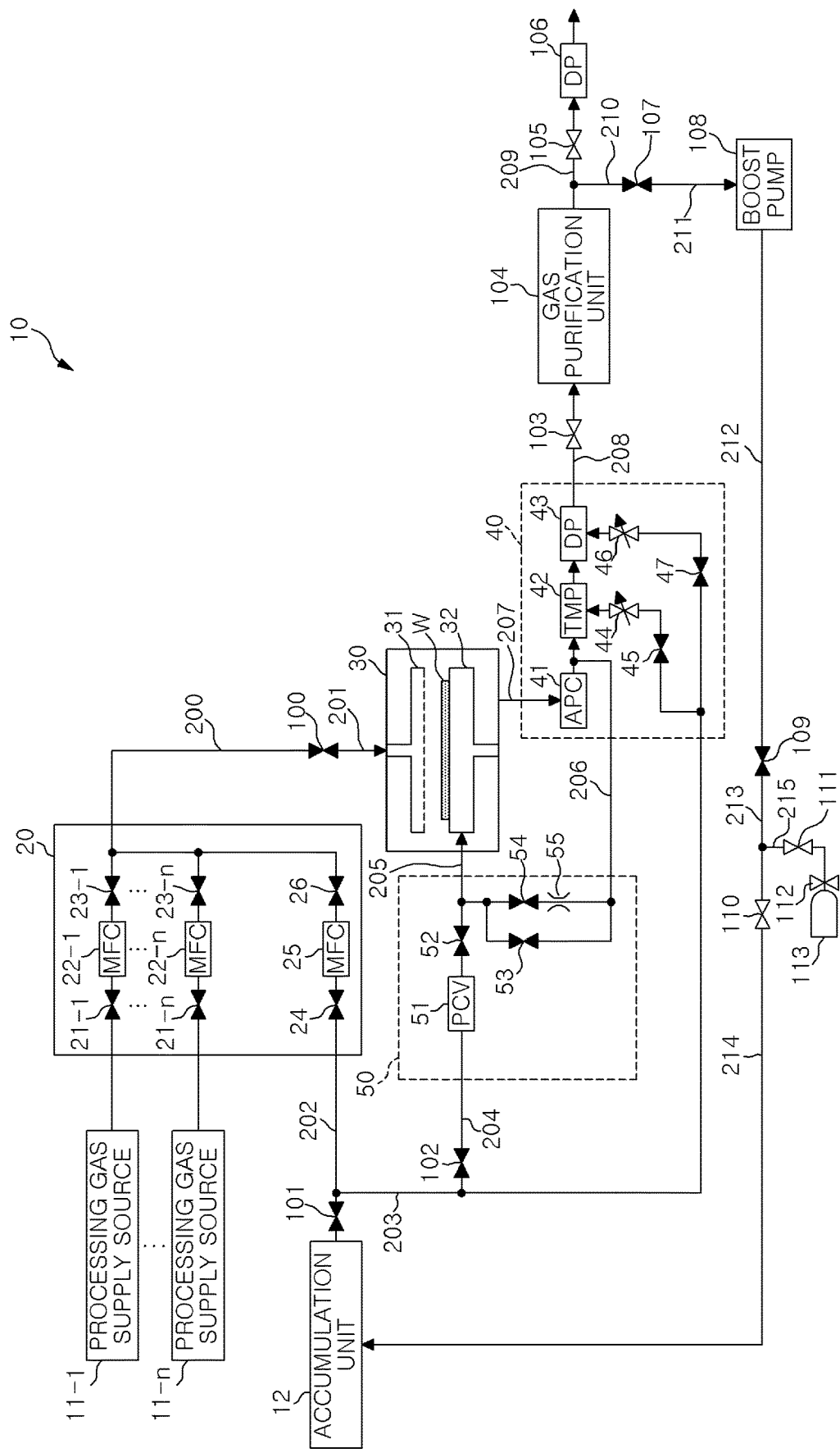
FIG. 4 shows a state of each valve at the time of filling a rare gas.

Next, the pipe is filled with a rare gas (S12). FIG. 4 shows a state of each valve at the time of filling a rare gas. In step S12, the valves 110 and 111 are controlled to be opened, and the pipes 213 and 214 between the valve 109 and the accumulation unit 12 are filled with the rare gas.

Figure 5:
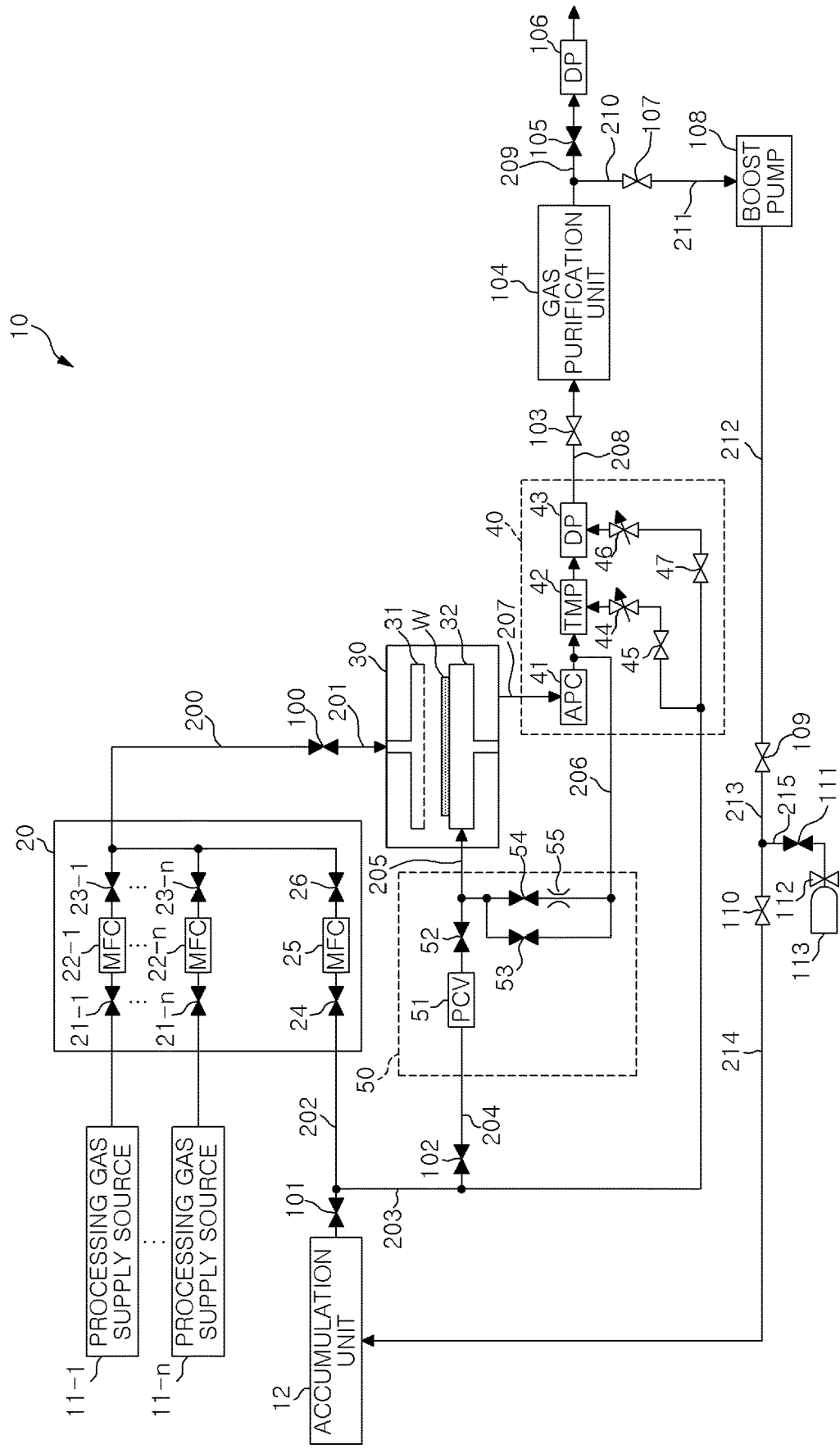
FIG. 5 shows a state of each valve at the time of idling.

Next, the valve 105 is controlled to be closed, and the DP 106 is stopped. Then, the valve 111 is controlled to be closed, and idling for circulating the rare gas is performed (S13). FIG. 5 shows a state of each valve at the time of idling. In the idling in the step S13, the valves 101, 45, 47, 107 and 109 are controlled to be opened, and the TMP 42 and the DP 43 operate. Then, the rare gas supplied from the accumulation unit 12 is supplied to the TMP 42 and the DP 43 through the pipe 203. Then, the rare gas is extracted from the gas exhausted from the DP 43 by the gas purification unit 104. The rare gas extracted by the gas purification unit 104 is boosted by the boost pump 108 and accumulated in the accumulation unit 12 again.

Figure 6:
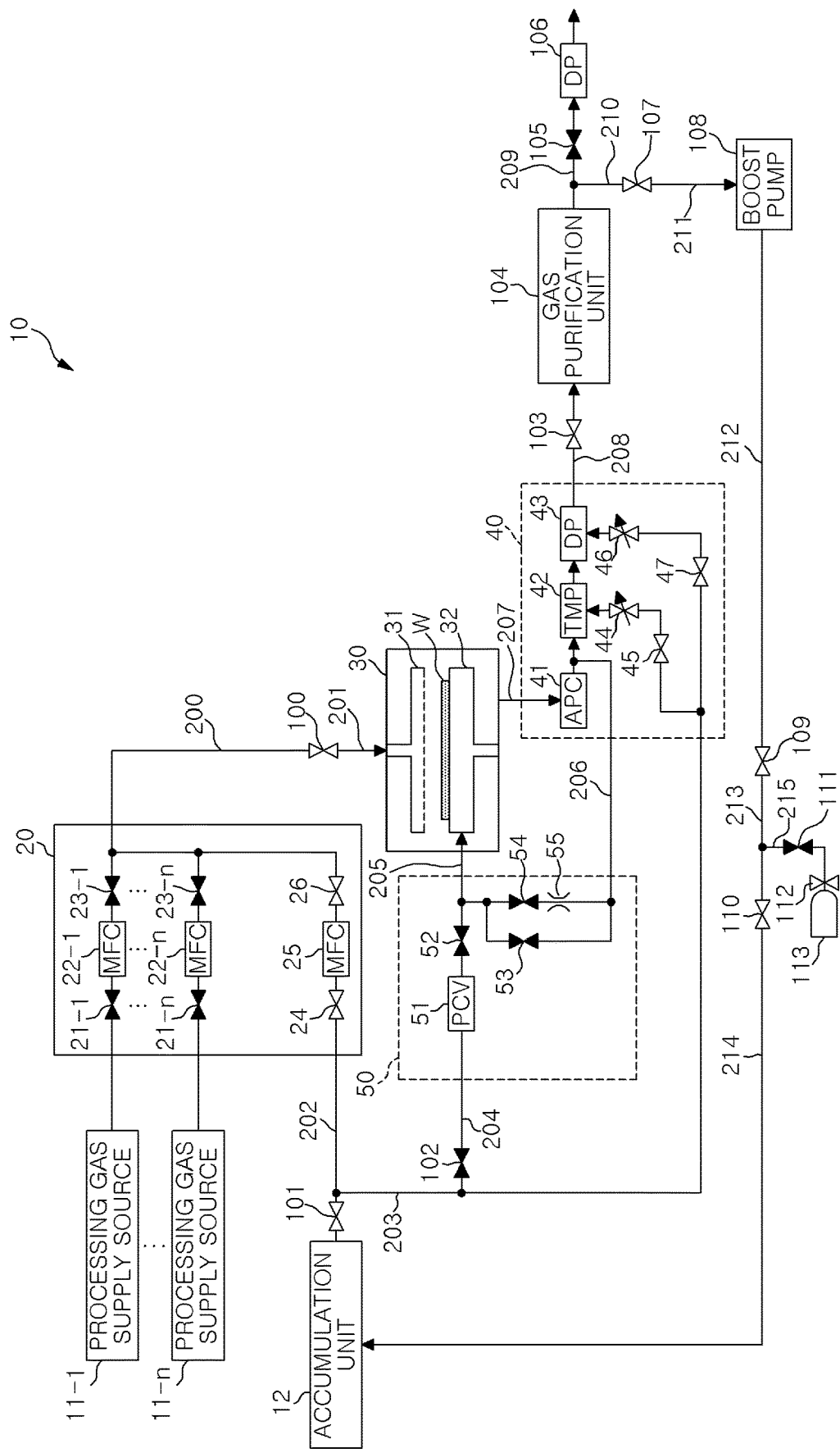
FIG. 6 shows a state of each valve at the time of supplying a rare gas.

Next, a rare gas is supplied into the chamber 30 (S14). FIG. 6 shows a state of each valve at the time of supplying a rare gas. In step S14, the valves 24, 26 and 100 are controlled to be opened, and the rare gas from the accumulation unit 12 is supplied into the chamber 30. The flow rate of the rare gas supplied into the chamber 30 is controlled by the MFC 25. A high frequency power is supplied into the chamber, and a DC voltage is applied from a power supply (not shown) to the electrostatic chuck of the mounting table 32. Accordingly, the semiconductor wafer W mounted on the electrostatic chuck is attracted and held by the electrostatic chuck.

Figure 7:
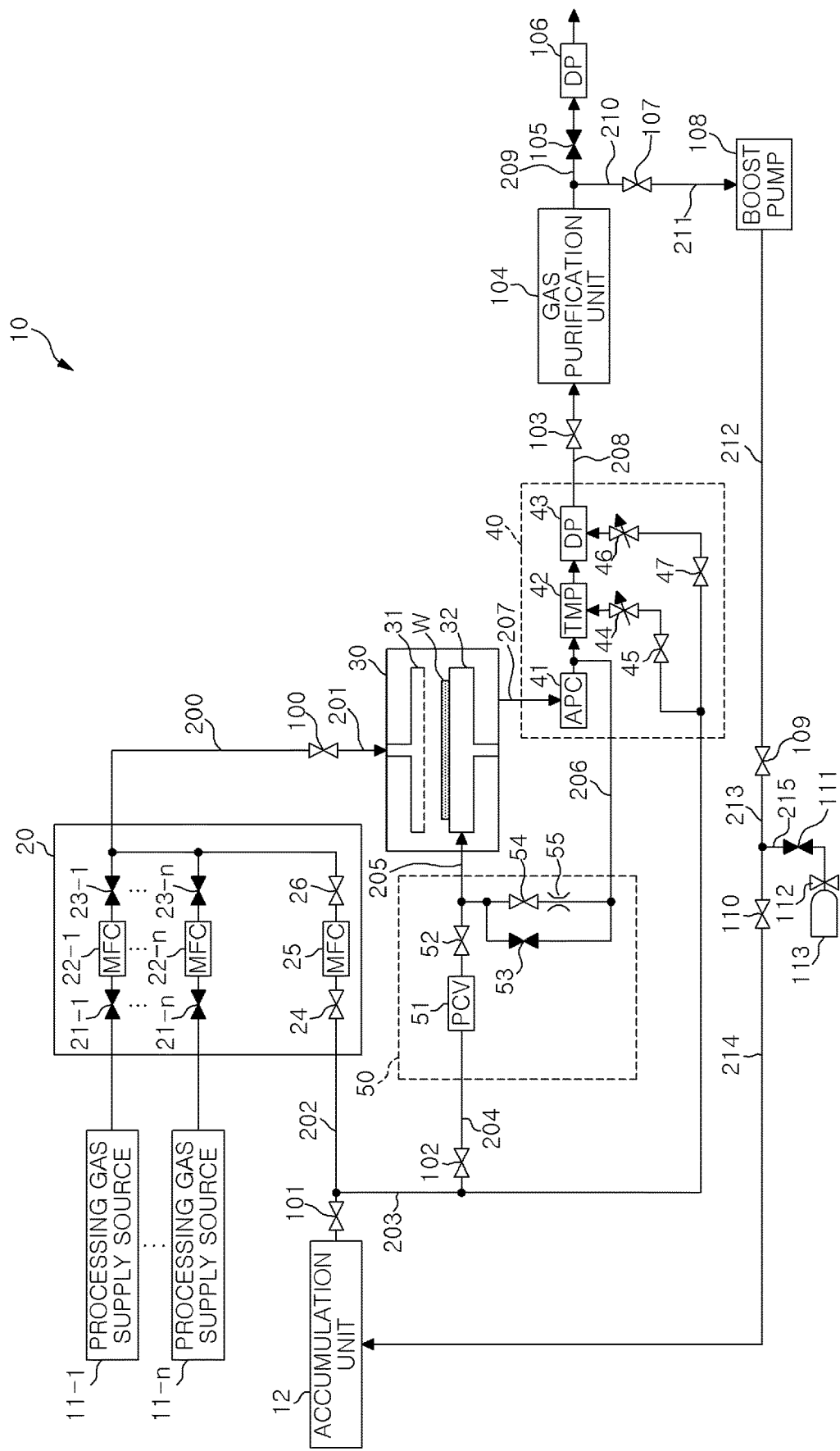
FIG. 7 shows a state of each valve at the time of supplying a rare gas to a gap between an upper surface of an electrostatic chuck and a backside of a semiconductor wafer.

Next, a rare gas is supplied from the accumulation unit 12 to a gap between the upper surface of the electrostatic chuck of the mounting table 32 and the backside of the semiconductor wafer W (S15). FIG. 7 shows a state of each valve at the time of supplying a rare gas to the gap between the upper surface of the electrostatic chuck and the backside of the semiconductor wafer W. In the step S15, the valves 102, 52 and 54 are controlled to be opened, and the rare gas from the accumulation unit 12 is supplied to the gap between the upper surface of the electrostatic chuck of the mounting table 32 and the backside of the semiconductor wafer W through the pipe 205. The pressure of the supplied rare gas is controlled by the PCV 51. A part of the rare gas outputted from the valve 52 is exhausted by the gas exhaust unit 40 through the valve 54, the orifice 55 and the pipe 206. The pressure of the supplied rare gas is, e.g., 1 Torr to 100 Torr.

Figure 8:
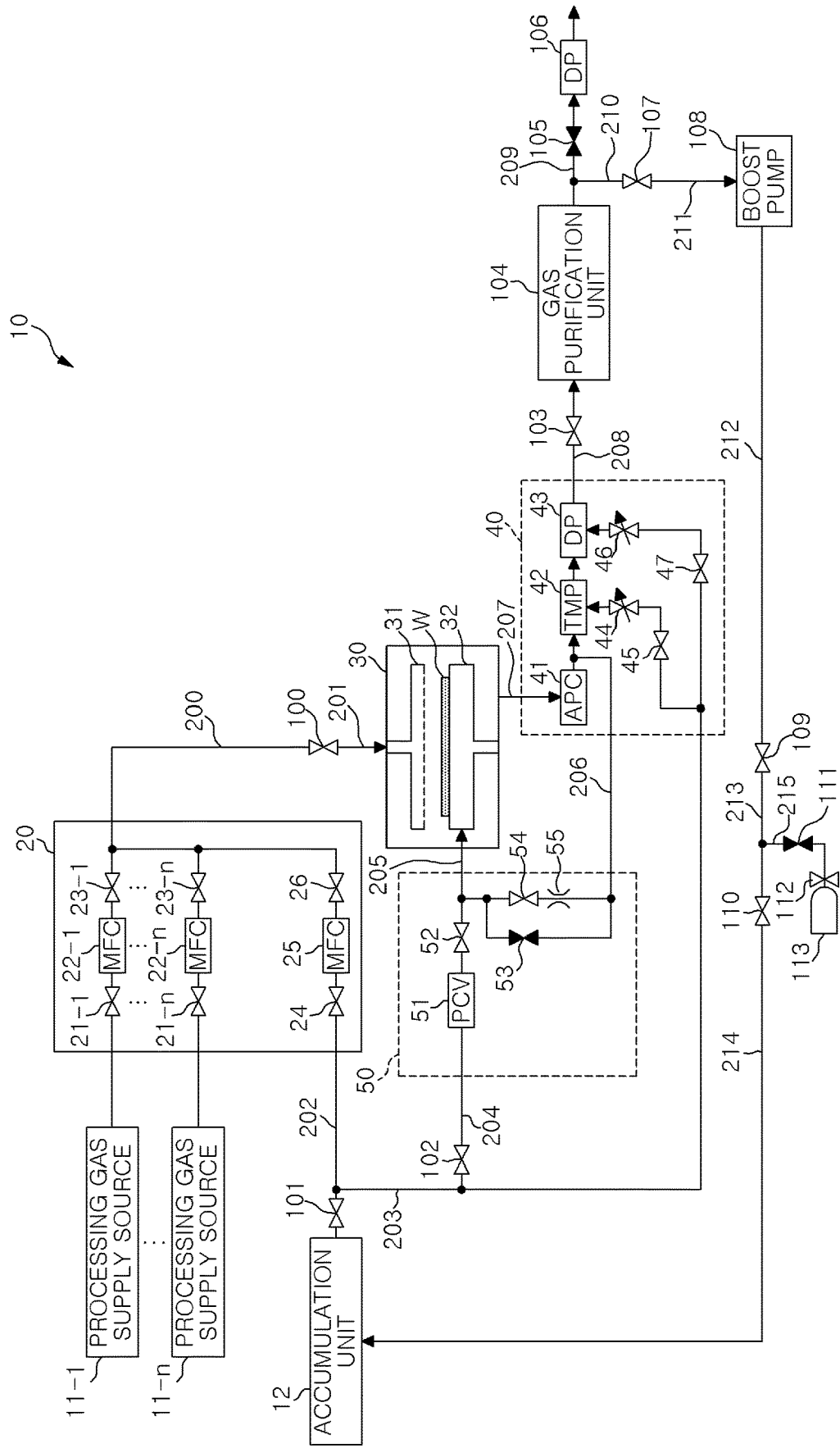
FIG. 8 shows a state of each valve at the time of performing processing.

Next, plasma processing is performed on the semiconductor wafer W. FIG. 8 shows a state of each valve at the time of performing the processing. In the processing for the semiconductor wafer W, the valves 21 and 23 are controlled to be opened, and the processing gas is supplied into the chamber 30 (S16). The flow rates of the processing gases are controlled by the corresponding MFCs 22. Then, the APC 41 controls the pressure in the chamber 30 to a predetermined pressure (S17). Then, a high frequency power from a high frequency generator (not shown) is applied to the shower head 31, and plasma of the gaseous mixture of the rare gas and the processing gas is generated in the chamber 30. Then, predetermined processing such as etching or the like is performed on the semiconductor wafer W by the generated plasma (S18).

The gas exhausted from the chamber 30 flows to the gas purification unit 104 through the pipe 207, the gas exhaust unit 40, the pipe 208 and the valve 103. The gas purification unit 104 separates the rare gas from the gas exhausted by the gas exhaust unit 40. The rare gas separated by the gas purification unit 104 flows to the boost pump 108 through the pipe 210, the valve 107 and the pipe 211. The boost pump 108 boosts the rare gas separated by the gas purification unit 104 to a predetermined pressure. The boosted rare gas is accumulated in the accumulation unit 12 through the pipe 212, the valve 109, the pipe 213, the valve 110 and the pipe 214.

Figure 9:
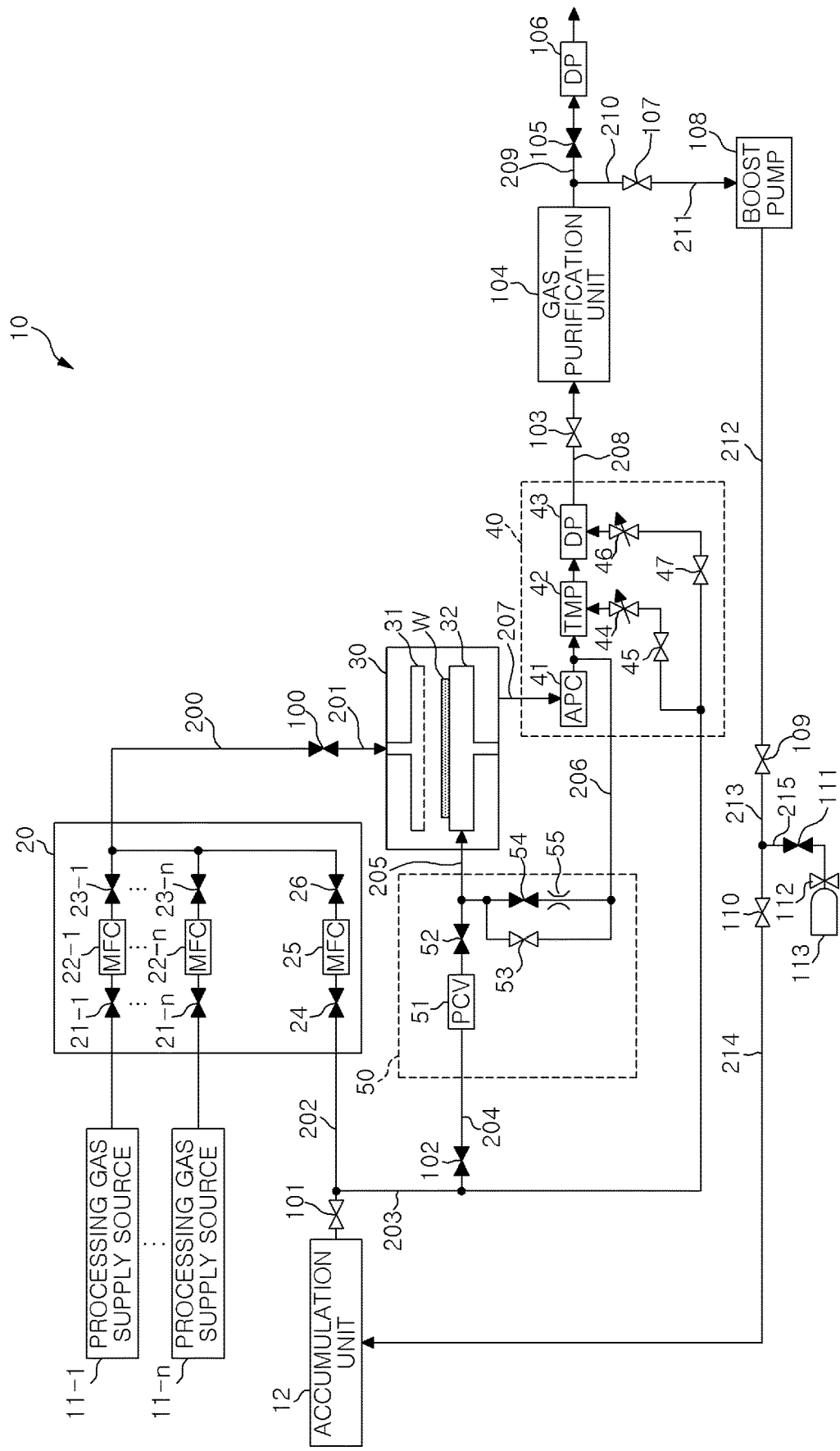
FIG. 9 shows a state of each valve at the time of detaching the semiconductor wafer from the electrostatic chuck.

When the plasma processing using the plasma is completed, the semiconductor wafer W is unloaded from the chamber 30 (S19). FIG. 9 shows a state of each valve at the time of detaching the semiconductor wafer W from the electrostatic chuck. In the step S19, the valves 21 and 23 are controlled to be closed, and the valves 24, 26, 100, 102, 52 and 54 are controlled to be closed. Then, the valve 53 is controlled to be opened, and the rare gas supplied to the gap between the upper surface of the electrostatic chuck of the mounting table 32 and the backside of the semiconductor wafer W is exhausted through the pipe 206. The application of the DC voltage to the electrostatic chuck of the mounting table 32 is released, and the attraction holding of the semiconductor wafer W by the electrostatic chuck is released. Then, the semiconductor wafer W is unloaded from the chamber 30.

The plasma processing system 10 of the first embodiment has been described above. As clear from the above description, in accordance with the plasma processing system 10 of the present embodiment, it is possible to simply and easily separate and recover the rare gas from the exhaust gas exhausted from the chamber 30.

In the plasma processing system 10 of the present embodiment, the rare gas is used as a gas to be added to the processing gas. In the plasma processing system 10 of the present embodiment, the rare gas is used as a heat transfer gas to be supplied to the gap between the electrostatic chuck of the mounting table 32 and the semiconductor wafer W. In the plasma processing system 10 of the present embodiment, the rare gas is used as a purge gas and a cooling gas for the TMP 42 and the DP 43. As for the heat transfer gas, the cooling gas, and the purge gas, an inert gas such as nitrogen gas or the like may be used instead of the rare gas. However, in the case of using nitrogen gas, it is difficult to separate nitrogen gas from the exhaust gas. Therefore, the nitrogen gas contained in the exhaust gas is exhausted to the outside of the plasma processing system 10.

On the other hand, in the plasma processing system 10 of the present embodiment, one rare gas such as Xe gas or the like is used as the heat transfer gas, the purge gas or the cooling gas for the gas exhaust unit 40. The rare gas such as Xe gas or the like can be easily separated from the other gases. The rare gas separated from the exhaust gas is boosted by the boost pump 108, returned to the accumulation unit 12, and reused. Accordingly, it is possible to reduce the consumption of a new rare gas and effectively utilize the rare gas.

Second Embodiment

In the first embodiment, the plasma processing system 10 for performing only one process using one rare gas has been described. However, in the plasma processing system 10 of the second embodiment, different processes using different rare gases are performed. Specifically, in the plasma processing system 10 of the second embodiment, a first process using a rare gas such as Xe gas or the like and a second process using a rare gas such as He gas, Ar gas or the like, or a gas which is relatively easily available, e.g., an inert gas such as $N_2$ gas or the like, are performed.

<Configuration of the Plasma Processing System 10>

Figure 10:
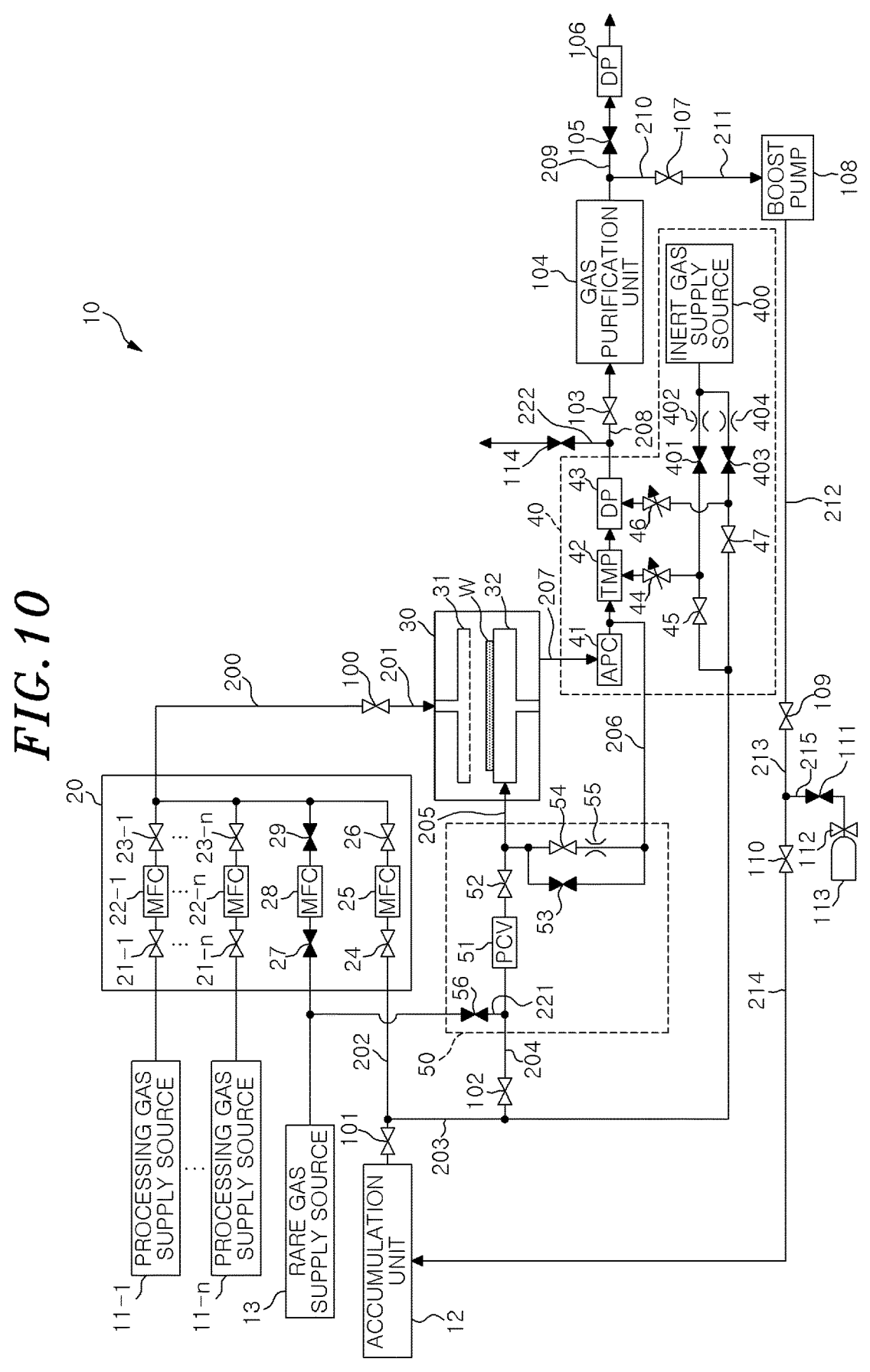
Figure 11:
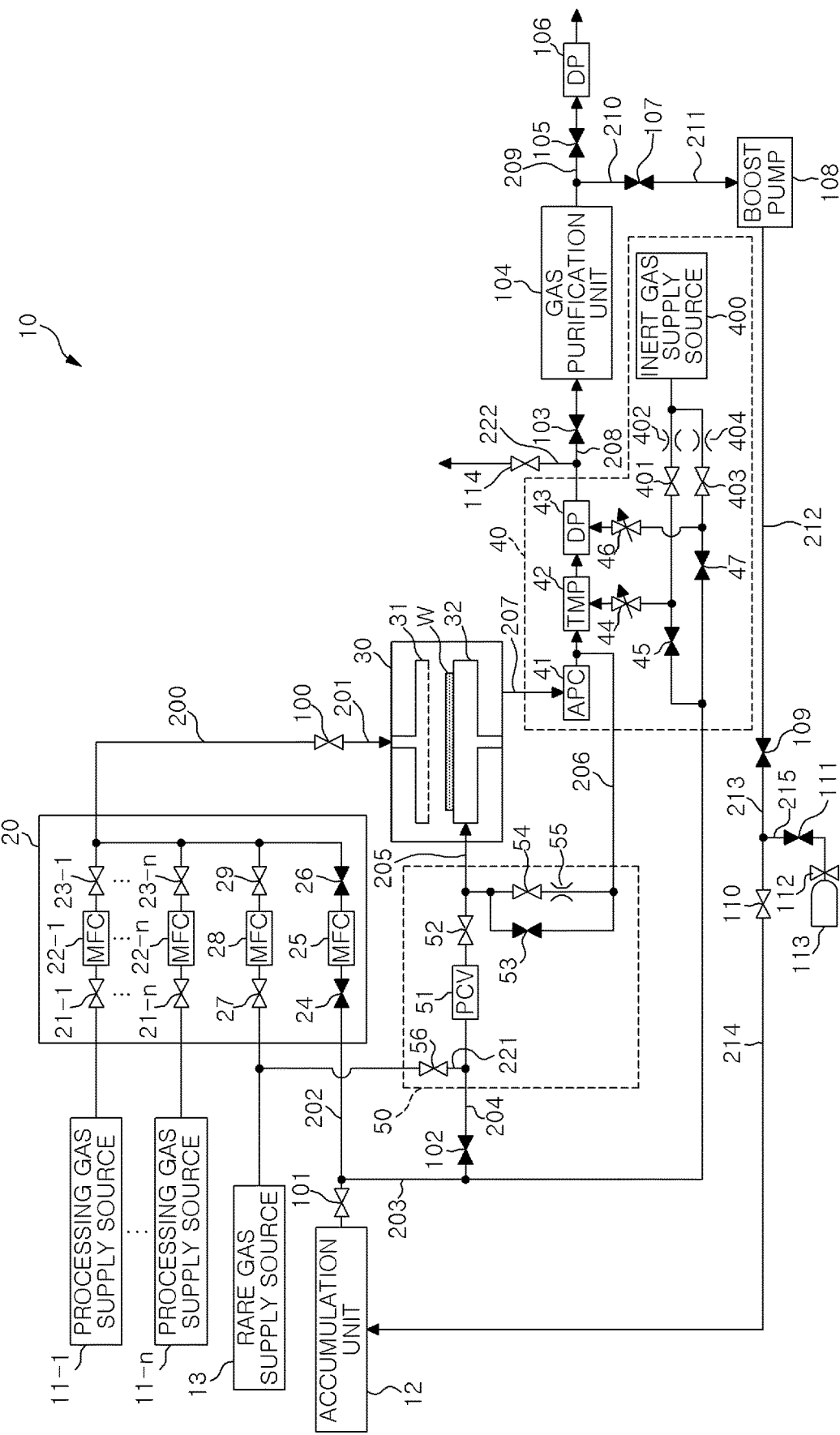
FIG. 11 is a system configuration diagram showing the example of the plasma processing system according to the second embodiment.

FIGS. 10 and 11 are system configuration diagrams showing an example of the plasma processing system 10 according to the second embodiment. FIG. 10 shows a state of each valve at the time of performing the first process. FIG. 11 shows a state of each valve at the time of performing the second process. In FIGS. 10 and 11, the components denoted by the same reference numerals as those in FIG. 1 have the same or similar functions as those in FIG. 1 and, thus, redundant description thereof will be omitted except for the following description.

The plasma processing system 10 of the present embodiment further includes a rare gas supply source 13 for supplying a rare gas different from the rare gas accumulated in the accumulation unit 12. The rare gas supply source 13 supplies a rare gas such as He gas, Ar gas or the like. The first gas supply unit 20 further includes a valve 27, an MFC 28, and a valve 29. A first end of the valve 27 is connected to the rare gas supply source 13 through a pipe. A second end of the valve 27 is connected to a first end of the MFC 28 through a pipe in the first gas supply unit 20. A second end of the MFC 28 is connected to a first end of the valve 29 through a pipe in the first gas supply unit 20. A second end of the valve 29 is connected to the valve 100 through a pipe 200. The MFC 28 controls the flow rate of the rare gas in response to an instruction from a control device (not shown).

The second gas supply unit 50 further includes a valve 56. A first end of the valve 56 is connected to the rare gas supply source 13 through a pipe 220. A second end of the valve 56 is connected to the PCV 51 via pipes 221 and 204. During the execution of the first process, the valve 102 is controlled to be opened and the valve 56 is controlled to be closed, as shown in FIG. 10, for example. Accordingly, the rare gas from the accumulation unit 12 is supplied to the chamber 30 through the valve 101, the pipe 203, the valve 102, the pipe 204, the PCV 51, the valve 52 and the pipe 205. On the other hand, during the execution of the second process, the valve 102 is controlled to be closed and the valve 56 is controlled to be opened, as shown in FIG. 11, for example. Accordingly, the rare gas from the rare gas supply source 13 is supplied to the chamber 30 through the pipe 220, the valve 56, the pipe 221, the pipe 204, the PCV 51, the valve 52 and the pipe 205. The valves 102 and 56 are examples of a second switching valve.

The gas exhaust unit 40 further includes an inert gas supply source 400, a valve 401, an orifice 402, a valve 403, and an orifice 404. The inert gas supply source 400 supplies an inert gas such as $N_2$ gas or the like. During the execution of the first process, the valves 45 and 47 are controlled to be opened, and the valves 401 and 403 are controlled to be closed, as shown in FIG. 10, for example. Accordingly, the rare gas from the accumulation unit 12 is supplied to the TMP 42 through the valve 101, the pipe 203, the valve 45 and the pressure control valve 44, and the rare gas from the accumulation unit 12 is supplied to the DP 43 via the valve 101, the pipe 203, the valve 47, and the pressure control valve 46. On the other hand, during the execution of the second process, the valves 45 and 47 are controlled to be closed, and the valves 401 and 403 are controlled to be opened, as shown in FIG. 11, for example. Accordingly, the inert gas from the inert gas supply source 400 is supplied to the TMP 42 through the orifice 402, the valve 401 and the pressure control valve 44, and the inert gas from the inert gas supply source 400 is supplied to the DP 43 through the orifice 404, the valve 403 and the pressure control valve 46. The valves 45, 47, 401 and 403 are examples of a third switching valve.

The plasma processing system 10 of the present embodiment further includes a valve 114. The valve 114 is connected to a pipe 222 connected to the pipe 208. During the execution of the first process, the valves 103, 107, and 109 are controlled to be opened, and the valve 114 is controlled to be closed, as shown in FIG. 10, for example. Accordingly, the exhaust gas exhausted from the DP 43 is sent to the gas purification unit 104 through the pipe 208, and the rare gas is separated from the exhaust gas by the gas purification unit 104. The rare gas separated by the gas purification unit 104 flows to the boost pump 108 through the pipe 210, the valve 107 and the pipe 211. The boost pump 108 boosts the rare gas separated by the gas purification unit 104 to a predetermined pressure. The boosted rare gas is returned to the accumulation unit 12 through the pipe 212, the valve 109, the pipe 213, the valve 110 and the pipe 214. On the other hand, during the execution of the second process, the valves 103, 107 and 109 are controlled to be closed, and the valve 114 is controlled to opened, as shown in FIG. 11, for example. Accordingly, the exhaust gas exhausted from the DP 43 is exhausted to the outside of the plasma processing system 10 through the pipe 208, the pipe 222 and the valve 114 without being transferred to the gas purification unit 104. The valves 103 and 114 are examples of the first switching valve.

The plasma processing system 10 of the second embodiment has been described above. As clear from the above description, in accordance with the plasma processing system 10 of the present embodiment, it is possible to simply and easily separate and recover the rare gas from the exhaust gas exhausted from the chamber 30. Further, in accordance with the plasma processing system 10 of the present embodiment, it is possible to perform in one chamber 30 the first process using a rare gas such as Xe gas or the like and the second process using the rare gas such as Ar gas or the like, or a gas which is relatively easily available, e.g., an inert gas such as $N_2$ gas or the like.

Third Embodiment

In the above-described first embodiment, one gas purification unit 104 and one first gas supply unit 20 are provided for one chamber 30. On the other hand, in a plasma processing system 10a of the third embodiment, one gas purification unit 104 and one first gas supply unit 20 are provided for a plurality of chambers 30. Therefore, it is possible to suppress the increase in the amount of equipment.

Figure 12:
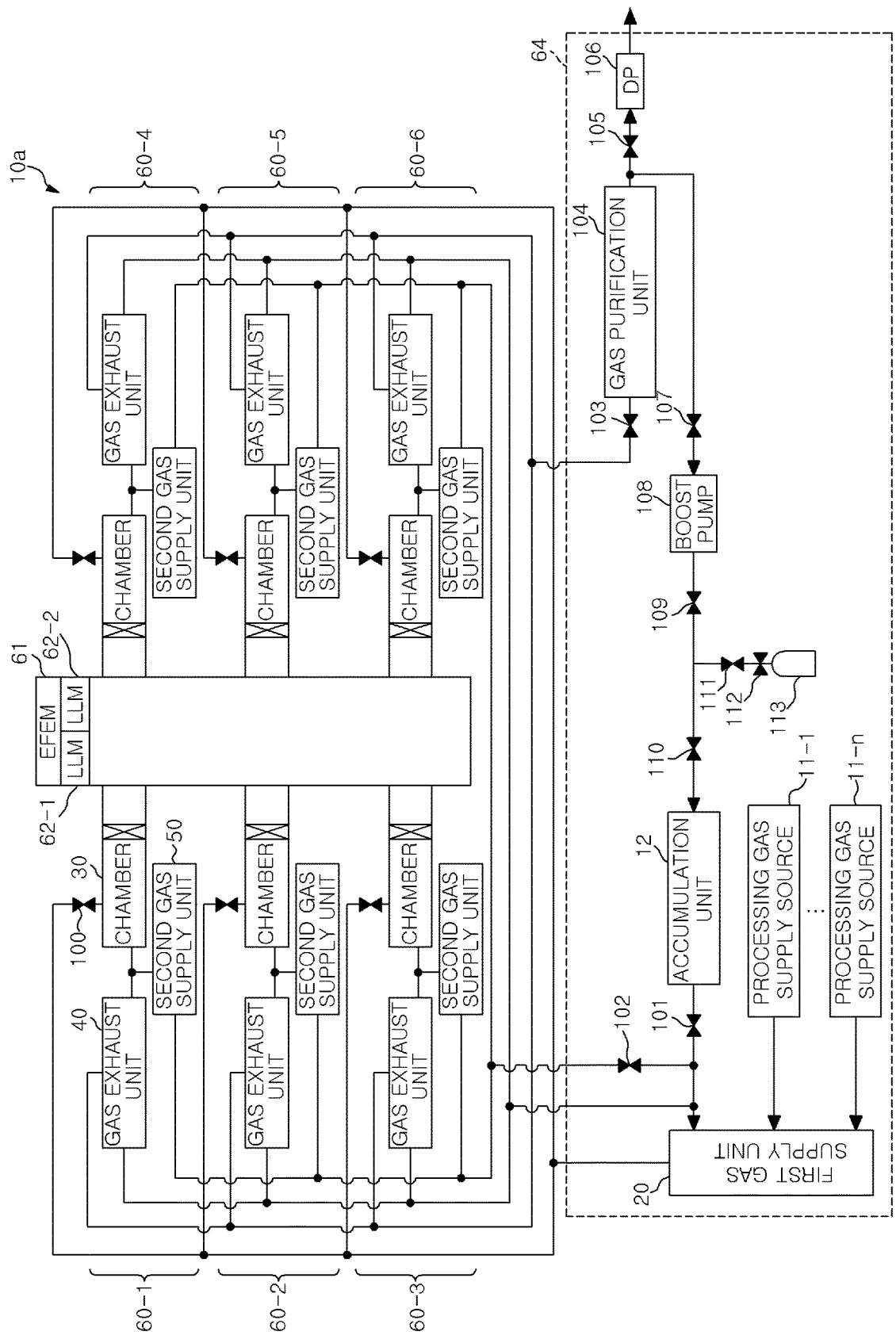
FIG. 12 is a system configuration diagram showing an example of a plasma processing system according to a third embodiment.

FIG. 12 is a system configuration diagram showing an example of the plasma processing system 10a of the third embodiment. The plasma processing system 10a of the present embodiment includes a plurality of process modules (PMs) 60-1 to 60-6, an equipment front end module (EFEM) 61, a plurality of load-lock modules (LLMs) 62-1 and 62-2, a vacuum transfer module (VTM) 63, and a circulation control unit 64.

Hereinafter, the PMs 60-1 to 60-n are collectively referred to as "PM 60" and the LLMs 62-1 and 62-2 are collectively referred to as "LLM 62" when it is not necessary to distinguish them. In the plasma processing system 10a illustrated in FIG. 12, six PMs 60 are illustrated. However, the plasma processing system 10a may include five or less PMs 60, or may include seven or more PMs 60.

Each PM 60 includes a valve 100, a chamber 30, a gas exhaust unit 40, and a second gas supply unit 50. The circulation control unit 64 includes a plurality of processing gas supply sources 11-1 to 11-n, an accumulation unit 12, a first gas supply unit 20, a valve 101, a valve 102, a valve 103, a gas purification unit 104, a valve 105, a DP 106, a valve 107, a boost pump 108, a valve 109, a valve 110, a valve 111, a valve 112, and a cylinder 113.

The gas outputted from the first gas supply unit 20 is supplied to the chamber 30 of each PM 60 via the valve 100 of each PM 60. The rare gas supplied from the accumulation unit 12 is supplied to the first gas supply unit 20 and the gas exhaust unit 40 of each PM 60 via the valve 101. The rare gas supplied from the accumulation unit 12 is supplied to the second gas supply unit 50 of each PM 60 via the valves 101 and 102. The exhaust gas exhausted from the gas exhaust unit 40 of each PM 60 flows to the gas purification unit 104 via the valve 103, and the rare gas is separated and recovered from the exhaust gas by the gas purification unit 104.

The plasma processing system 10a of the third embodiment has been described above. As clear from the above description, in accordance with the plasma processing system 10a of the present embodiment, it is possible to simply and easily separate and recover the rare gas from the exhaust gas exhausted from each chamber 30. Further, in accordance with the plasma processing system 10a of the present embodiment, it is possible to suppress the increase in the amount of equipment.

Fourth Embodiment

Figure 13:
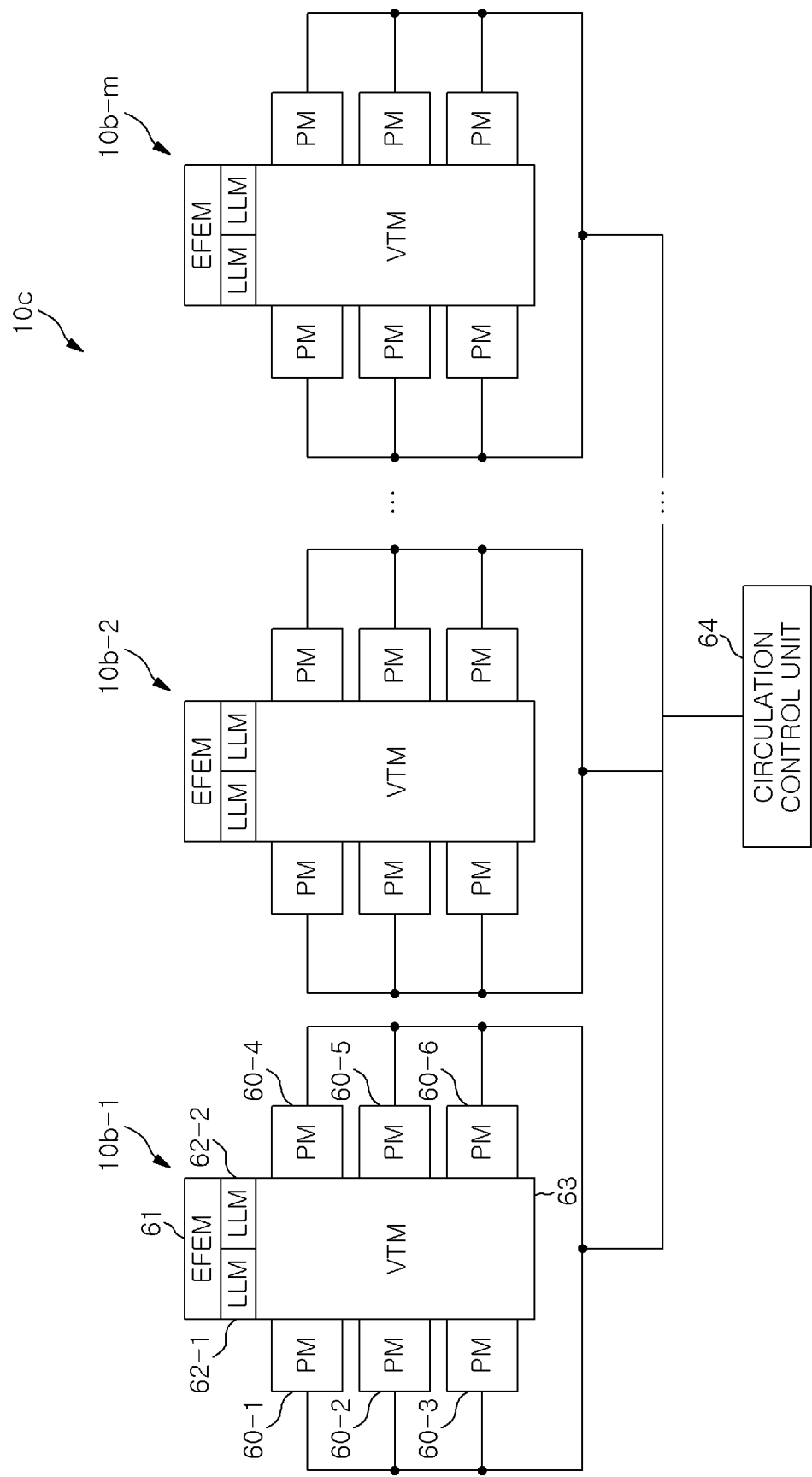
FIG. 13 is a system configuration diagram showing an example of a plasma processing system according to a fourth embodiment.

In the above-described third embodiment, one circulation control unit 64 is provided for a plurality of PMs 60 connected to one VTM 63. On the other hand, in a plasma processing system 10c of the fourth embodiment, one circulation control unit 64 is provided for a plurality of sub-systems 10b-1 to 10b-m (m being an integer greater than or equal to 1), as shown in FIG. 13, for example. FIG. 13 is a system configuration diagram showing an example of the plasma processing system 10c of the fourth embodiment. Each sub-systems 10b-1 to 10b-m includes a VTM 63 and a plurality of PMs 60 connected to the VTM 63. Accordingly, it is possible to suppress the increase in the amount of equipment.

Other Embodiments

The present disclosure is not limited to the above-described embodiments, and various modifications can be made within the scope of the gist of the present disclosure.

For example, in each of the above-described embodiments, the rare gas accumulated in the accumulation unit 12 is Xe gas. However, the present disclosure is not limited thereto, and the rare gas accumulated in the accumulation unit 12 may be another rare gas such as krypton (Kr) gas or the like.

In each of the above-described embodiments, the chamber 30 is, e.g., a parallel plate type plasma processing chamber. However, the present disclosure is not limited thereto. The chamber 30 may be an inductively coupled plasma (ICP) processing chamber, a microwave processing chamber, or the like as long as a semiconductor wafer W is processed by using plasma of a gaseous mixture supplied from the first gas supply part 20.

Figure 14:
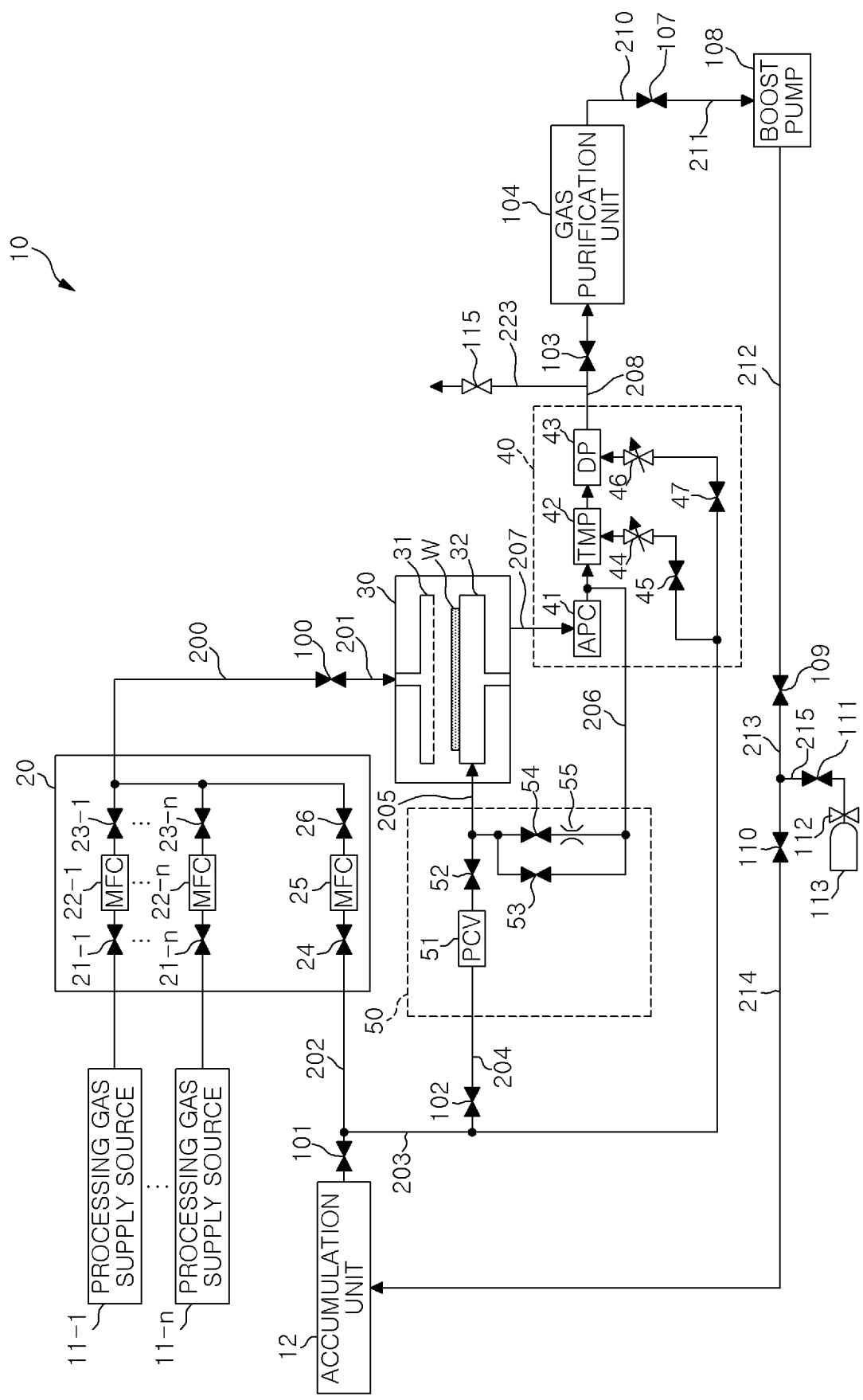
FIG. 14 is a system configuration diagram showing another example of the plasma processing system.

In the above-described first embodiment, as shown in FIG. 1, for example, the DP 106 is connected to the gas purification unit 104 through the pipe 209 and the valve 105. When the chamber 30 is evacuated, as shown in FIG. 3, for example, the valve 103 and the valve 105 are controlled to be opened, and the gas in the chamber 30 is exhausted by the DP 106. However, the present disclosure is not limited thereto. As shown in FIG. 14, for example, the valve 115 connected to the pipe 223 connected to the pipe 208 between the gas exhaust unit 40 and the valve 103 may be provided. Further, when the chamber 30 is evacuated, as shown in FIG. 14, for example, the valve 115 is controlled to be opened, and the valve 103 is controlled to be closed. Then, the gas in the chamber 30 is exhausted to the outside of the plasma processing system 10 through the pipe 223 and the valve 115 by a gas exhaust pump (not shown). Accordingly, when the chamber 30 is evacuated, the gas does not pass through the gas purification unit 104 and, thus, the consumption of the gas purification unit 104 can be suppressed. In the configuration shown in FIG. 14, the pipe 209, the valve 105 and the DP 106 may be provided as shown in FIG. 1 and the like.

In each of the above-described embodiments, the first gas supply unit 20 mixes the rare gas and the processing gas and supplies the gaseous mixture into the chamber 30. However, the present disclosure is not limited thereto. For example, the rare gas and the processing gas whose flow rates are controlled by the first gas supply unit 20 may be separately supplied into the chamber 30 and then mixed in the chamber 30.

While the present disclosure has been shown and described with respect to the embodiments, it will be understood by those skilled in the art that various changes and modifications may be made without departing from the scope of the present disclosure as defined in the following claims.

What is claimed is:

1. A plasma processing method comprising:
   supplying a first rare gas and a processing gas into a chamber;
   processing a target substrate by plasma of a gaseous mixture obtained by mixing the first rare gas and the processing gas;
   exhausting a gas containing the first rare gas from the chamber by a gas exhaust unit;
   separating the first rare gas from the gas exhausted from the chamber by a separating unit;
   boosting the separated first rare gas; and
   accumulating the boosted first rare gas in an accumulation unit,
   wherein the processing gas is provided from a processing gas supply source, and
   wherein in said supplying, the processing gas from the processing gas supply source and the first rare gas supplied from the accumulation unit are supplied to a first gas supply unit, and then from the first gas supply unit into the chamber.

2. A plasma processing method comprising:
   supplying a first rare gas and a processing gas into a chamber;
   processing a target substrate by plasma of a gaseous mixture obtained by mixing the first rare gas and the processing gas;
   exhausting a gas containing the first rare gas from the chamber by a gas exhaust unit;
   separating the first rare gas from the gas exhausted from the chamber by a separating unit:
   boosting the separated first rare gas; and
   accumulating the boosted first rare gas in an accumulation unit,
   wherein in said supplying, the processing gas and the first rare gas supplied from the accumulation unit are supplied into the chamber,
   the method further comprising:
   supplying the first rare gas to a gap between the target substrate and a mounting table that is provided in the chamber and mounts thereon the target substrate, and
   wherein in said supplying the first rare gas to the gap, the first rare gas supplied from the accumulation unit is supplied into the gap.

3. The plasma processing method of claim 1, further comprising:
   supplying the first rare gas as a purge gas or a cooling gas for the gas exhaust unit to the gas exhaust unit,
   wherein in said supplying the first rare gas to the gas exhaust pit, the first rare gas supplied from the accumulation unit is supplied to the gas exhaust unit.

4. The plasma processing method of claim 2, further comprising:
   supplying the first rare gas as a purge gas or a cooling gas for the gas exhaust unit to the gas exhaust unit,
   wherein in said supplying the first rare gas to the gas exhaust unit, the first rare gas supplied from the accumulation unit is supplied to the gas exhaust unit.

5. The plasma processing method of claim 1, further comprising:
   operating a first switching valve configured to switch whether to transfer the gas exhausted from the chamber by the gas exhaust unit to the separating unit or to discharge the gas to outside without transferring the gas to the separating unit.

6. The plasma processing method of claim 5, wherein the first switching valve transfers the gas exhausted from the chamber by the gas exhaust unit to the separating unit during a first process and discharges the gas exhausted from the chamber by the gas exhaust unit to the outside without transferring the gas to the separating unit during a second process,
   the first rare gas is supplied from the accumulation unit into the chamber during the first process and a second rare gas different from the first rare gas is supplied into the chamber during the second process.

7. A plasma processing method comprising:
   supplying a first rare gas and a processing gas into a chamber;
   processing a target substrate by plasma of a gaseous mixture obtained by mixing the first rare gas and the processing gas;
   exhausting a gas containing the first rare gas from the chamber by a gas exhaust unit;

separating the first rare gas from the gas exhausted from the chamber by a separating unit;

boosting the separated first rare gas;

accumulating the boosted first rare gas in an accumulation unit, wherein in said supplying, the processing gas and the first rare gas supplied from the accumulation unit are supplied into the chamber, operating a first switching valve configured to switch whether to transfer the gas exhausted from the chamber by the gas exhaust unit to the separating unit or to discharge the gas to outside without transferring the gas to the separating unit; and operating a second switching valve configured to switch whether to supply the first rare gas supplied from the accumulation unit to a gap between the target substrate and a mounting table that is provided in the chamber and mounts thereon the target substrate or to supply a second rare gas different from the first rare gas to the gap.

8. The plasma processing method of claim 6, further comprising:

operating a second switching valve configured to switch whether to supply the first rare gas supplied from the accumulation unit to a gap between the target substrate and a mounting table that is provided in the chamber and mounts thereon the target substrate or to supply a second rare gas different from the first rare gas to the gap.

9. The plasma processing method of claim. 8, wherein the second switching valve supplies the first rare gas supplied from the accumulation unit to the gap during the first process and supplies the second rare gas to the gap during the second process.

10. The plasma processing method of claim 5, further comprising:

operating another switching valve different from the first switching valve, the another switch valve configured to switch whether to supply, as a purge gas or a cooling gas for the gas exhaust unit, the first rare gas supplied from the accumulation trait to the gas exhaust unit or to supply, as the purge ga.s or the cooling gas for the gas exhaust unit, an inert gas to the gas exhaust unit.

11. The plasma processing method of claim 6, further comprising:

operating a third switching valve configured to switch whether to supply, as a purge gas or a cooling gas for the gas exhaust unit, the first rare gas supplied from the accumulation unit to the gas exhaust unit or to supply, as the purge gas or the cooling gas for the gas exhaust unit, an inert gas to the gas exhaust unit.

12. The plasma processing method of claim 7, further comprising:

operating a third switching valve configured to switch whether to supply, as a purge gas or a cooling gas for the gas exhaust unit, the first rare gas supplied from the accumulation unit to the gas exhaust unit or to supply, as the purge gas or the cooling gas for the gas exhaust unit, an inert gas to the gas exhaust unit.

13. The plasma processing method of claim 9, further comprising:

operating a third switching valve configured to itch whether to supply, as a purge gas or a cooling gas for the gas exhaust unit, the first rare gas supplied from the accumulation unit to the gas exhaust unit or to supply, as the purge gas or the cooling gas for the gas exhaust unit, an inert gas to the gas exhaust unit.

14. The plasma processing method of claim 11, wherein the third switching valve supplies, as the purge gas or the cooling gas for the gas exhaust unit, the first rare gas supplied from the accumulation unit to the gas exhaust unit during the first process, and supplies the inert gas as the purge gas or the cooling gas for the gas exhaust unit to the gas exhaust unit during the second process.

15. The plasma processing method of claim 1, wherein the first rare gas is xenon gas or krypton gas.

16. The plasma processing method of claim 1, further comprising:

providing a second rare gas to the first gas supply unit, the second rare gas provided from a rare gas supply source separate from the accumulation unit, and selectively providing either the first rare gas or the second rare gas into the chamber.

17. The plasma processing method according to claim 16, including performing a first process and a second process, and wherein:

in the first process, the first rare gas is supplied from the accumulation unit to the first gas supply unit and then into the chamber, and the first rare gas is separated from gas exhausted from the chamber by the separation unit, and in the second process, the second rare gas is supplied from the rare gas supply source to the first gas supply unit and then into the chamber, and gas exhausted from the chamber is discharged without being transferred to the separation unit so that the second rare gas is not separated.

18. The plasma processing method according to claim 17, wherein the first rare gas comprises Xe and the second rare gas comprises Ar.

19. The plasma processing method according to claim 1, including performing a first process and a second process, and wherein:

in the first process, the first rare gas is supplied from the accumulation unit to the first gas supply unit and then into the chamber, and the first rare gas is separated from gas exhausted from the chamber by the separation unit, and in the second process, an inert gas is supplied to the chamber, and gas exhausted from the chamber is discharged without being transferred to the separation unit so that the inert gas is not separated.

* * * * *